(12) United States Patent
Matsuki et al.

(10) Patent No.: US 6,914,336 B2
(45) Date of Patent: Jul. 5, 2005

(54) SEMICONDUCTOR DEVICE STRUCTURE AND METHOD FOR MANUFACTURING THE SAME

(75) Inventors: Takeo Matsuki, Tokyo (JP); Yoshihiro Takaishi, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 506 days.

(21) Appl. No.: 09/764,880

(22) Filed: Jan. 23, 2001

(65) Prior Publication Data

US 2001/0010402 A1 Aug. 2, 2001

(30) Foreign Application Priority Data

Jan. 25, 2000 (JP) ........................................ 2000-015215

(51) Int. Cl.⁷ ............................................. H01L 23/52
(52) U.S. Cl. ........................ 257/769; 257/758; 438/299
(58) Field of Search .............................. 257/758, 759, 257/755, 385; 438/74, 299

(56) References Cited

U.S. PATENT DOCUMENTS

| | | | | | |
|---|---|---|---|---|---|
| 5,364,810 A | * | 11/1994 | Kosa et al. | .................... | 437/52 |
| 5,366,911 A | * | 11/1994 | Lur et al. | ..................... | 437/40 |
| 5,641,991 A | * | 6/1997 | Sakoh | ........................ | 257/755 |
| 5,914,518 A | * | 6/1999 | Nguyen et al. | ............. | 257/377 |
| 5,929,524 A | * | 7/1999 | Drynan et al. | .............. | 257/758 |
| 5,998,251 A | * | 12/1999 | Wu et al. | .................... | 438/241 |
| 6,074,921 A | * | 6/2000 | Lin | ........................... | 438/299 |
| 6,096,595 A | * | 8/2000 | Huang | ........................ | 438/238 |
| 6,096,644 A | * | 8/2000 | Lukanc | ....................... | 438/674 |
| 6,130,102 A | * | 10/2000 | White, Jr. et al. | .............. | 438/3 |
| 6,130,124 A | * | 10/2000 | Lee | ............................. | 438/240 |
| 6,184,584 B1 | * | 2/2001 | Sakao | ........................ | 257/758 |
| 6,222,722 B1 | * | 4/2001 | Fukuzumi et al. | .......... | 361/305 |
| 6,265,779 B1 | * | 7/2001 | Grill et al. | .................. | 257/759 |
| 6,271,122 B1 | * | 8/2001 | Wieczorek et al. | ......... | 438/627 |
| 6,291,861 B1 | * | 9/2001 | Iwata et al. | ................. | 257/385 |

FOREIGN PATENT DOCUMENTS

| | | |
|---|---|---|
| JP | 62-262443 | 11/1987 |
| JP | 9-232251 | 9/1997 |
| JP | 11-97528 | 4/1999 |
| JP | 11-145283 | 5/1999 |
| JP | 11-224939 | 8/1999 |
| JP | 11-330413 | 11/1999 |
| KR | 99-88255 | 12/1999 |

* cited by examiner

*Primary Examiner*—David Nelms
*Assistant Examiner*—Thinh T Nguyen
(74) *Attorney, Agent, or Firm*—Young & Thompson

(57) ABSTRACT

The present invention provides a structure for a semiconductor device, capable of eliminating the generation of defective products due to poor connection. In the present semiconductor device, an n-type high concentration diffusion layer 2 is selectively formed on the P-type silicon substrate 1, and on the diffusion layer 2, a silicon oxide film 3 is formed as a first interlayer insulating film 3. A silicon plug 4 is disposed on the n-type high concentration diffusion layer 2. On the top end surface of the polysilicon plug 4, a silicide pad 5 is formed in a self-aligning manner such that the width of the silicide pad 5 is larger than that of the polysilicon plug 4. A second interlayer insulating film is formed so as to cover the first interlayer insulating film 3 and the silicide pad 5, and a tungsten plug 7 is disposed on the silicide pad 5. On the second interlayer insulating film, wiring 8, made of an aluminum-copper alloy and connected to the tungsten plug, is formed.

18 Claims, 6 Drawing Sheets

SURFACE LEVEL OF FIRST INSULATING FILM AFTER IT IS ETCHED

SURFACE LEVEL OF FIRST INTERLAYER INSULATING FILM AFTER POLYSILICON IS ETCHED BACK

SEMICONDUCTOR DEVICE STRUCTURE AND METHOD FOR MANUFACTURING THE SAME

BACKGROUND OF THE INVENTION

1. Field of the Invention

The present invention relates to a semiconductor device structure and method of manufacturing the same, and in particular relates to a structure of a silicon LSI (Large Scale Integrated) circuit and a method for manufacturing the same.

2. Background Art

Conventionally, performance and function of the silicon LSI circuit have been improved by contracting the design rule step by step based on scaling in computer graphics. In order to improve yields in the manufacturing process of the silicon LSI circuits, it is indispensable to improve the technique of forming wiring and contacts for connecting elements.

In manufacturing a silicon LSI circuit, a plurality of elements such as MOSFETs (Metal Oxide Semiconductor Field Effect Transistors), which are selectively arranged on the silicon substrate, are connected using contact plugs for wiring for forming a desired electronic circuit.

Furthermore, in order to provide a complicated circuit, wiring is formed by a multiple layered structure through interlayer insulating layers, and in each layer, wiring is formed by connections using contact holes, which are filled with a conductive material. If the contact hole cannot be formed at a prescribed connecting position, then the circuit becomes an open circuit to cause malfunction. If the contact area is small in the case of connection using contact holes, the contact resistance increases which results in deterioration in the circuit performance. Accordingly, it is desired to integrate circuits with the lowest possible contact resistance.

Regarding the multiple layered wiring, a structurally simple example is described with reference to FIGS. 5A–5C. FIG. 5A shows a method for directly connecting a first contact plug 24 and a second contact plug 26.

As shown in FIG. 5A, on a semiconductor substrate 21, an element separating insulating film 22, a first interlayer insulating film 23, the first contact plug 24, a second interlayer insulating film 25, and the second contact plug 26 are arranged.

The first contact plug 24 and the second contact plug 26 are directly connected to each other by making the upper end of the first contact plug 24 in contact with the lower end of the second contact plug 26. The upper end surface of the first contact plug 24 is displaced by a distance A1 with the lower end surface of the second plug 26. This displacement is caused by mechanical error.

FIG. 5B shows one of methods for connecting the first contact plug 34 and the second contact plug 37 by inserting an electrically conductive pad 35 (for example, made of a metal silicide) between the upper end surface of the first contact plug 34 and the lower end surface of the second contact plug 37.

As shown in FIG. 5B, on a semiconductor substrate 31, an element separating insulating film 32, a first interlayer insulating film 33, the first contact plug 34, a second interlayer insulating film 36, and the second contact plug 37 are arranged. As seen in the figure, there is a displacement with a distance A2 between the first contact plug 34 and the second contact plug 37. In addition, there is a displacement with a distance of A3 between the pad 35 and the second contact plug 37. These displacements of A2 and A3 are caused by mechanical errors, similar to the case of A1 shown in FIG. 5A.

The projection area of the pad 35, inserted between the upper end surface of the first contact plug 34 and the lower end surface of the second contact plug 37, is larger than the planer area of the contact hole in the lower layer. This pad 35 is formed after forming the first contact plug 34 by forming a film of a material used for the pad and by machining the film by photolithography. Accordingly, the alignment margin, corresponding to an allowable dimensional tolerance, expands by a half of the difference between the pad size and the surface area of the contact plug.

FIG. 5C shows a method, in which, without forming a contact hole, one contact plug 45 is formed by making the second contact hole penetrate from the second insulating film to the substrate surface.

As shown in FIG. 5C, there are provided on a semiconductor substrate 41, an element separating insulating film 42, a first interlayer insulating film 43, a second interlayer insulating film 44, and a contact plug 45.

Another example of the method shown in FIG. 5C using the contact plug is a conventionally known memory cell, that is, DRAM (Dynamic Random Access Memory) having a contact plug. An example of the cross-sectional structure of this type of memory cell is explained with reference to FIG. 6. In this structure, wiring for calling signals, which is called a bit line or a signal line, is formed under the layer lower than the charge accumulation capacitor 60.

A selectively formed element separating insulating film 52 and a MOSFET film are formed on the P-type silicon substrate, and on these films, an n-type conduction-type gate electrode 53 made of polysilicon is formed through a silicon oxide gate insulating film.

A first interlayer insulating film 56 is formed so as to cover the element separating film 52 and the MOSFET. In order to connect the source-drain regions 51 and the first wiring layer formed on the first interlayer insulating film 56, polysilicon plugs 54 and 55 are formed. The bit wiring 57 on the first interlayer insulating film 56 is made of tungsten suicide. A second interlayer insulating film 58 is formed so as to cover the bit wiring. A bottom electrode 59 of the capacitor is formed on the second interlayer, a capacitor dielectric film 60 is formed so as to cover the bottom electrode 59, and the upper layer of the capacitor dielectric film 60 is an upper electrode 61. The bottom electrode 59, the capacitor dielectric film 60, and the upper electrode 61 constitute a charge accumulation capacitor.

In the conventional silicon LSI circuit shown in FIG. 5A, the mask alignment accuracy is not quite high because it depends largely on machine accuracy. If the alignment shifts more than a half of the diameter of the contact plug, the contact area is reduced and the contact resistance increases.

When the second contact plug is formed on the location of the first contact plug, a shift in the mask alignment of more than a half of the diameter of the contact plug results in the failure of the device.

In the case of the method shown in FIG. 5B, when a mask processor is used for arranging the pad, the position of the pad depends on the alignment accuracy, and the position of the pad is not accurate enough to connect the contact plugs on both sides of the pad.

In the case of the method shown in FIG. 5C, since the long contact plug is formed, excessive etching time is normally set considering the homogenity of the dry etching in the dry etching of the surface. Thereby, too much of the silicon substrate near the contact plug is removed too much such that the electrical property of the substrate is changed, which causes the problem of disturbing the formation of the contact plug in an accurate alignment. When the diameter of the contact plug is small and the depth of the contact plug is large, that is, when the aspect ratio of the contact hole is large, the problem arises that throughput becomes low and contact resistance becomes high.

When it is necessary to fill silicon as a plug material in a contact hole, which has a large aspect ratio, filling is normally carried out by CVD (Chemical Vapor Deposition). However, if the amount of the material gas supplied to the reaction chamber is not reduced sufficiently, taking the mean free path of the particles in the space into consideration, the contact hole will not be filled with silicon, and voids or seams are generated in the contact hole. If the amount of silicon gas is reduced in order to prevent generation of voids or seams, the throughput of the filling process is reduced.

SUMMARY OF THE INVENTION

It is therefore an object of the present invention to provide a structure for a semiconductor device and a method for manufacturing the semiconductor device, capable of preventing connection failure of the contact plugs without causing an increase in the product failures or contact resistances.

A structure for a semiconductor device, provided with a contact plug, which is formed by opening a contact hole through a first interlayer insulating film on a silicon substrate and by filling the contact hole with silicon, comprises, a silicide pad formed on the upside surface of the silicon plug in a self-aligning manner and having a diameter which is larger than that of the silicon plug; wherein, the top surface of said silicide pad is formed above the top surface of said first interlayer insulating film.

A method for manufacturing a semiconductor device, provided with a contact plug, which is formed by opening a contact hole through a first interlayer insulating film formed on a silicon substrate and filling the contact hole with silicon, comprising the steps of: forming a first insulating film on said silicon substrate, forming said contact hole through said first interlayer insulating film, filling said contact hole with a silicon plug, and forming a silicide pad having a larger diameter than that of said silicon plug in a self-aligning manner, wherein, the top surface of said silicide pad is disposed above the top surface of said first interlayer insulating surface.

That is, in the structure of the semiconductor device of the present invention comprising a contact plug having a silicon plug, a silicide pad, having a larger diameter than that of the silicon plug and formed in a self-aligning manner, is disposed on the top surface of the silicon plug such that the top surface of the silicide pad is located above the top surface of the first interlayer insulating film.

In a structure of a semiconductor device of the present invention, said silicide pad is formed by a refractory metal silicide.

A method for manufacturing a semiconductor device according to the present invention comprises the step of forming a first insulating film on said silicon substrate, forming said contact hole through said first interlayer insulating film, filling said contact hole with a silicon plug, forming said silicide pad by selectively and partially removing the insulating film and silicon at least in the vicinity of said contact plug such that the plug protrudes, depositing a refractory metal film such as titanium or cobalt, converting the refractory metal film into the refractory metal silicide by heat treatment, and removing said refractory metal film remaining without being converted into silicide and reaction products between said refractory metal and an atmospheric gas during heat treatment.

More practically, the present invention relates to a technique for connection between a wiring layer and a substrate or between wiring for connecting elements and wiring separated by an insulating layer in a semiconductor integrated circuit, in which active elements such as transistors and passive elements such as resistors and capacitors are integrated on a substrate surface.

In manufacturing the above integrated circuit, a conventional technique is used which is known as well formation, in which a well is formed by introducing an impurity into a P-type or N-type silicon substrate, the specific resistance of which can be selected optionally, for forming a local region provided with a different conduction type from that of the substrate. Generally, the surface of the silicon substrate is covered by an insulating film such as silicon oxide for selectively separating elements to be formed on the substrate surface.

In the present semiconductor device, active elements such as MOSFETs are arranged in between the element separating the insulating film. A first interlayer insulating film is formed covering the element separating film and the transistors. A first wiring is formed on the first interlayer insulating film.

On the first interlayer insulating film, a contact plug for connection to the second wiring separated by a second interlayer insulating film is formed and a pad for connection to the underlying contact plug are formed in a U-shape in a self aligning manner. This pad is made of a silicide of a refractory metal.

Consequently, since the silicide pad formed on the polysilicon plug has a large projection area, the larger area of the silicide pad than the plug provides larger design freedom in connecting the upside contact plug than the case of having no pad.

In addition, since the silicide pad formed on the top surface of the first contact plug is disposed in a self-aligning manner, the silicide pad is not only aligned with the first contact plug but also be sufficiently aligned with the second contact plug, the first and second contact plug can be securely connected without generating defective products.

DETAILED DESCRIPTION OF THE INVENTION

Figure 1:
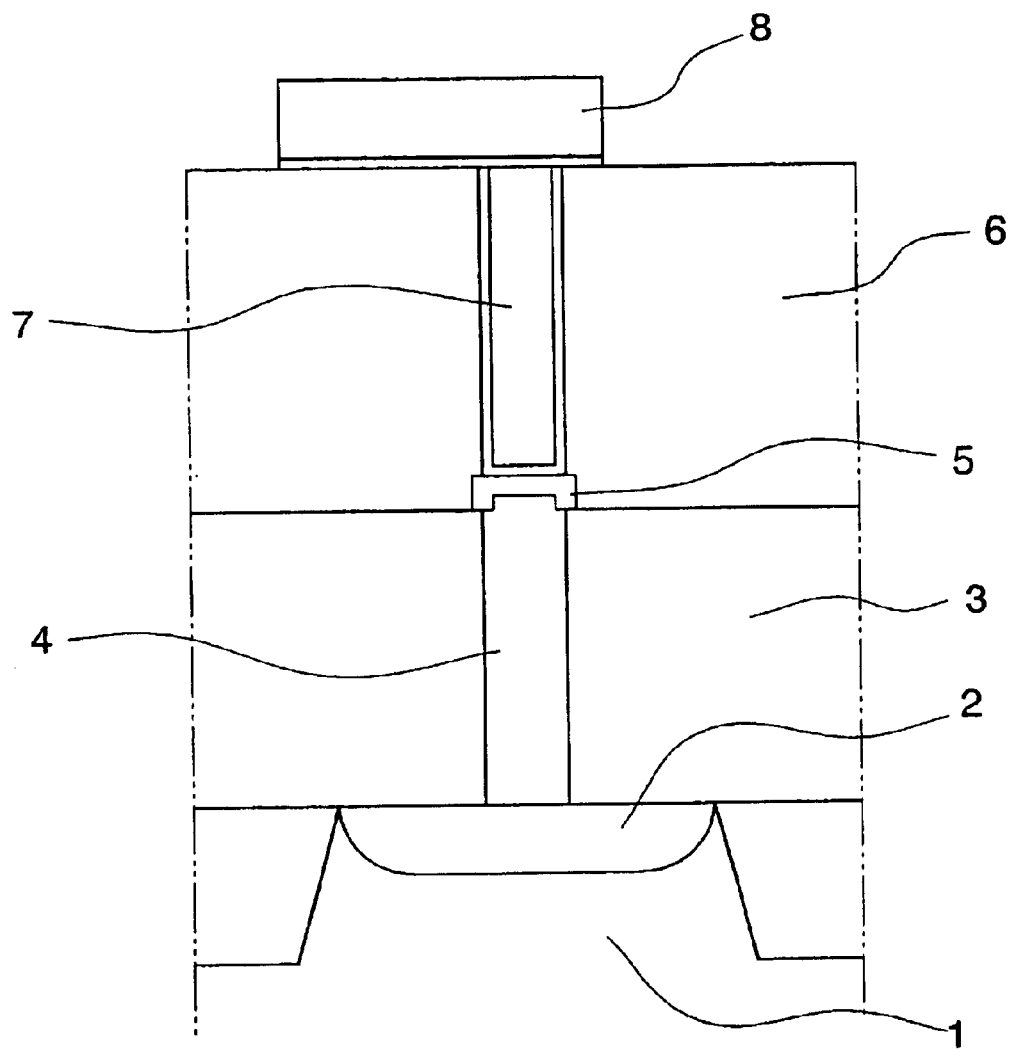
FIG. 1 is a cross-sectional view showing a structure of a semiconductor device according to the first embodiment of the present invention.

Hereinafter, several embodiments of the present invention are described with reference to the attached drawings. FIG. 1 is a cross-sectional view showing a structure of a semiconductor device according to the first embodiment of the present invention. Here, only the portion relevant to the present invention in the integrated circuit formed on the semiconductor substrate will be explained in order to simplify the explanation.

As shown in FIG. 1, a silicon oxide film selectively formed for element separation and an n-type high concentration diffusion layer 2, doped with a high concentration N-type impurity, are formed on a P-type silicon substrate 1. On the element separated surface, a silicon oxide film (CVD oxide film) or BPSG (Boro-Phospho-Silicate-Glass) film are arranged as the first interlayer insulating film 3. The film thickness is within a range of from 500 nm to 1.5 $\mu$m. In the present embodiment, a film thickness of 500 nm is adopted.

On the n-type high concentration diffusion layer 2, a polysilicon plug (n-type) 4 is disposed. This polysilicon is sufficiently doped with an n-type impurity. The preferable concentration of the impurity is within a range of 1 to $1.5 \times 10^{20}$ cm$^{-3}$. If the concentration of the impurity is low, Schottky barriers are formed at the upper and lower interfaces with the silicide layers in contact with the poysilicon plug 4, which causes high contact resistance.

At the end of the upper polysilicon plug 4, a silicide pad 5 made of titanium silicide (TiSi$_2$) is formed in a U-shape in a self-aligning manner with the silicon plug 4. The titanium metal for forming silicide may be replaced with cobalt, tungsten, molybdenum, or tantalum.

A feature of this structure is that the width of the silicide pad 5 is larger than the width of the silicon plug 4. In addition, a second interlayer insulating film 6 is formed covering the first interlayer insulating film 3 and the silicide pad 5. A tungsten plug 7 filled with tungsten is located on the silicide pad 5 through a barrier film. On the second interlayer insulating film, wiring 8 made of an alloy composed of an aluminum-copper alloy is formed.

The silicide pad 5, formed on the upper end of the polysilicon plug 4, has a larger projection area than that of the polysilicon plug 4, and, in the arrangement of the tungsten plug connected to the silicide pad 5, the freedom of the design increases as much as the incremental area of the silicide pad from the project area of the polysilicon plug 4.

Since the suicide pad 5, formed on the upper end surface of polysilicon plug 4, is disposed in a self-aligning manner, the silicide pad 5 is aligned on the polysilicon plug and there is room to align the silicide pad on the tungsten plug 7, so that the connection between the silicide pad and the polysilicon plug 4 and the tungsten plug 7 can be secured without concern for failure in connection.

Figure 2A:
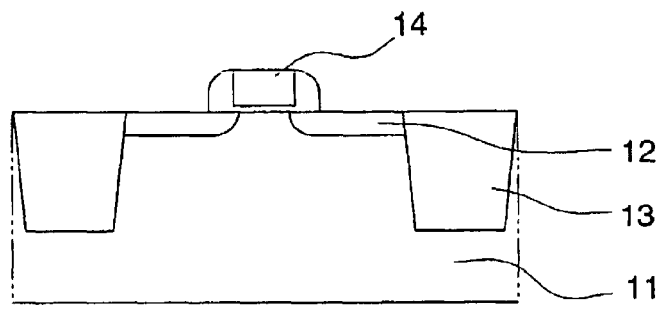
FIGS. 2A to 2C are cross-sectional views showing the manufacturing process for a semiconductor device according to the first embodiment of the present invention.
Figure 2B:
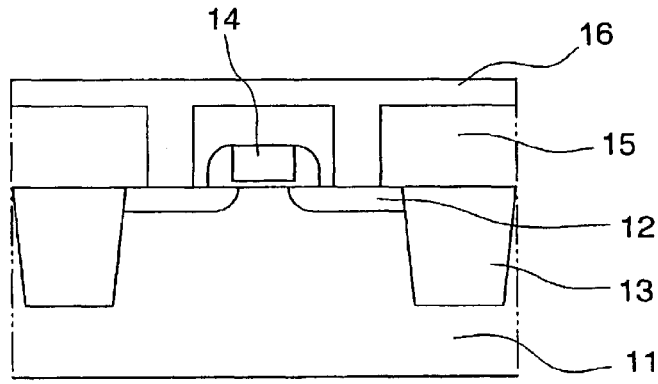
Figure 2C:
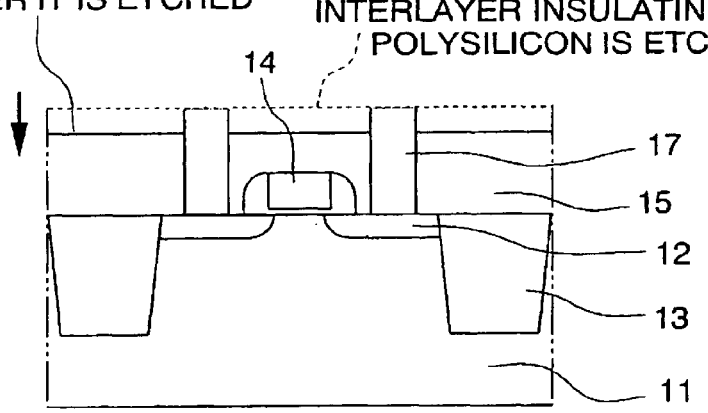
Figure 3A:
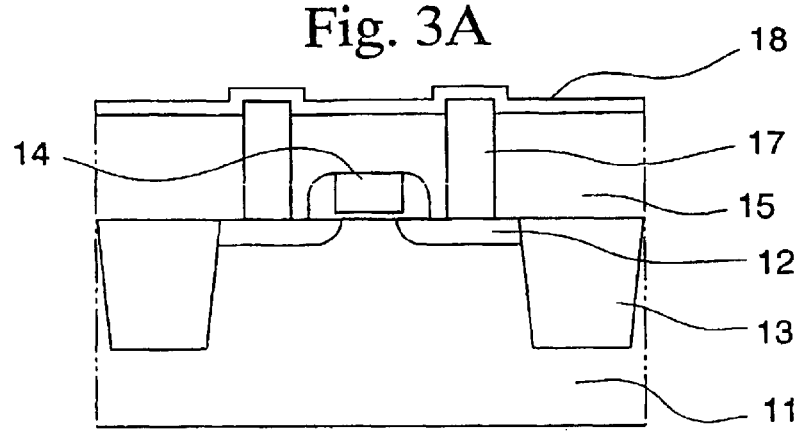
FIGS. 3A to 3C are cross-sectional views showing the manufacturing process for a semiconductor device according to the first embodiment of the present invention.
Figure 3B:
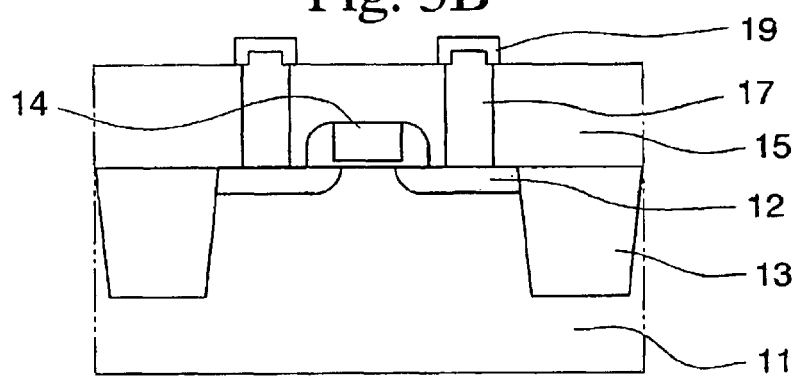
Figure 3C:
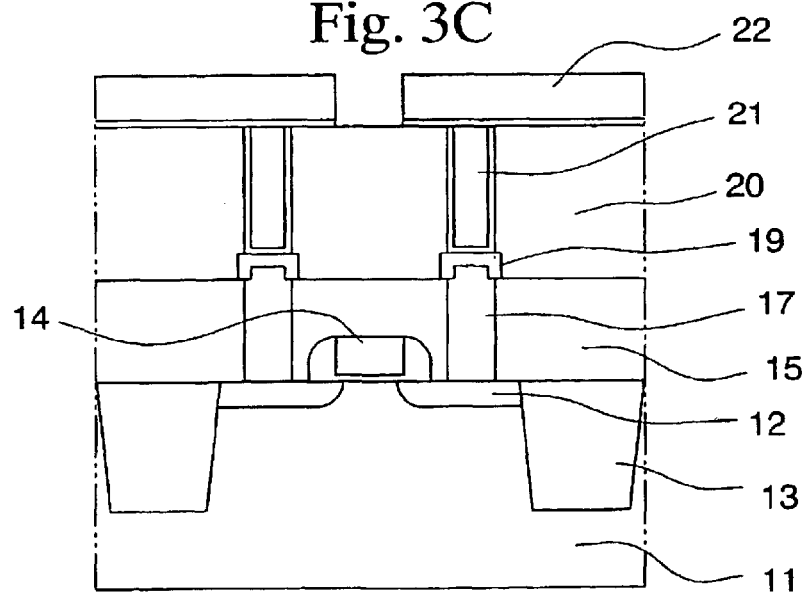

FIGS. 2 and 3 show a manufacturing process of the semiconductor device according to the first embodiment of the present invention. The manufacturing process of the present invention is described below with reference to FIGS. 2 and 3.

A silicon oxide element separating insulating film 13 is formed on a P-type silicon substrate 11 by the conventionally known method. The conventionally known methods include the LOCOS (Local Oxidation of Silicon) and the trench separation method.

When the MOSFET is formed, the gate electrode 14 made of polysilicon is formed through a gate insulating film. As a measure to cope with the shortening distance between a channel and the other channel of the transistor, a sidewall film is formed by depositing a silicon oxide film or a silicon nitride film on the sidewall. The preferable method for forming the sidewall film is CVD. The thickness of the sidewall film is selected within a range of from 30 to 100 $\mu$m.

Subsequently, an N-type impurity such as As or P ions is introduced into the P-type silicon substrate 11 by ion-implantation and thus the N-type high concentration impurity region is formed on the substrate surface. Thereby, the source-drain region 12 is formed on both sides of the gate electrode 14.

After ion-implantation, a heat treatment is executed in a nitrogen atmosphere for electrical activation of the impurities doped in the P-type silicon and for recovery of the crystal defects in the silicon substrate. The preferable temperature for the heat treatment ranges from 700 to 900° C., and the most preferable temperature is 800° C. (refer to FIG. 2A).

Subsequently, the BPSG film is deposited at a thickness of 300 to 1000 nm by CVD method using ozone as an oxidizing agent. In order to prevent diffusion of water in the film, a two layer structure may be preferably formed by depositing the silicon oxide film first as an underlying layer by CVD before depositing the BPSG film.

The contact hole is formed so as to open on the high concentration impurity layer (the source-drain region) using a resist mask. After removing the resist mask used for forming the contact hole, the polysilicon film 16 is formed on the front surface by CVD.

At this time, it is preferable to introduce phosphorus or arsenic in the polysilicon film. It is possible to introduce phosphorus or arsenic into the film by introducing gas containing hydrogenated phosphorus (phosphine) or arsine together with the material gas into the reaction chamber. The thickness of the film is preferably formed thicker than the opening radius of the contact hole.

Other methods for introducing impurity into the polysilicon film 16 include ion-implantation and thermal diffusion. In order to distribute the impurity ions in the polysilicon film 16, ion-implantation is repeatedly executed a plurality of times, and then the film 16 is subjected to a heat treatment at a temperature of more than 750° C. (as shown in FIG. 2B).

By an etch-back process of the polysilicon film 16, the polysilicon film 16 is embedded in the first interlayer insulating film 15 and the polysilicon plug 17 is formed, as shown in FIG. 2C (the dotted line in the figure indicates the surface of the first interlayer insulating film 15).

The silicon oxide film is selectively removed from the first interlayer insulating film 15. The thickness of the film to be removed is preferably 20 to 100 nm, and the thickness of 50 nm is more preferable. The removal is carried out by use of aqueous solutions such as hydrofluoric acid and hydrofluoric acid including buffers such as ammonium or acetic acid. When a protrusion of the polysilicon can be made by a dry-etching process using a gas system such as C8 or F8, which has an etching activity selective for the polysilicon over that for the single crystal silicon (refer to FIG. 2C).

Subsequently, a titanium (Ti) film 18 is formed by sputtering. The preferable thickness of the titanium film is in a range of 20 to 50 nm, and 30 nm is selected in the present embodiment. The titanium may be replaced with cobalt, tungsten, molybdenum, or tantalum (refer to FIG. 3A).

Subsequently, a BPSG film is formed at a thickness of 500 nm as the second interlayer insulating film 20 on the above formed films. The second contact hole is opened through the second interlayer insulating film 20 by conventionally known photolithography and the dry-etching process. A titanium nitride film is formed by spattering as a barrier layer between the adhered layer and silicon for forming the tungsten plug 21, and a tungsten layer 22 is formed by CVD for forming the second wiring.

At this time, titanium 18 reacts with silicon and nitrogen and titanium silicide and titanium nitride are formed. The unreacted metal titanium may remain if the conditions of the thermal treatment are not satisfactory. When an inert gas such as Argon is used in the reaction chamber, the silicide and the excess metal will remain after the reaction.

The titanium nitride and the unreacted metal titanium, remaining in the heating process, are removed by selectively etching the silicon nitride and the metal titanium. A solution of ammonium and hydrogen peroxide is a preferable etchant for selective removal. When cobalt silicide is formed, it is preferable to use a mixed solution of hydrochloric acid and the hydrogen peroxide for removing the remaining cobalt metal and cobalt nitride (refer to FIG. 3B).

Subsequently, a BPSG film is formed at a thickness of 500 nm as the second interlayer insulating film on the above formed films. The second contact hole is opened through the second interlayer insulating film by conventionally known photolithography and the dry-etching process. A titanium nitride film is formed by spattering as a barrier layer between the adhered layer and silicon for forming the tungsten plug 21, and a tungsten layer is formed by CVD for forming the second wiring.

The manufacturing method described above according to one embodiment of the present invention can be applied to the wiring connection process for all types of silicon LSI circuit.

The manufacturing method of semiconductor devices according to one embodiment of the present invention determines the location of the suicide pads 5, 19 with respect to a polysilicon plug 17 in a self-aligning manner. The above-described effects are thus obtained. Since the above-described process does not require masks for forming silicide pads 5 and 19, the length of the process can be reduced.

When the masks are used, the outside area of the silicide pad extending from the projection area of the plug becomes asymmetrical due to the shift of the mask alignment. However, the present invention makes the outside area of the silicide pad extending from the plug symmetrical by the self-alignment process. Thereby, when a plurality of contact plugs are located adjacent to each other, and when the wirings are located adjacent to each other, the possibility of causing a short circuit can be reduced.

Figure 4:
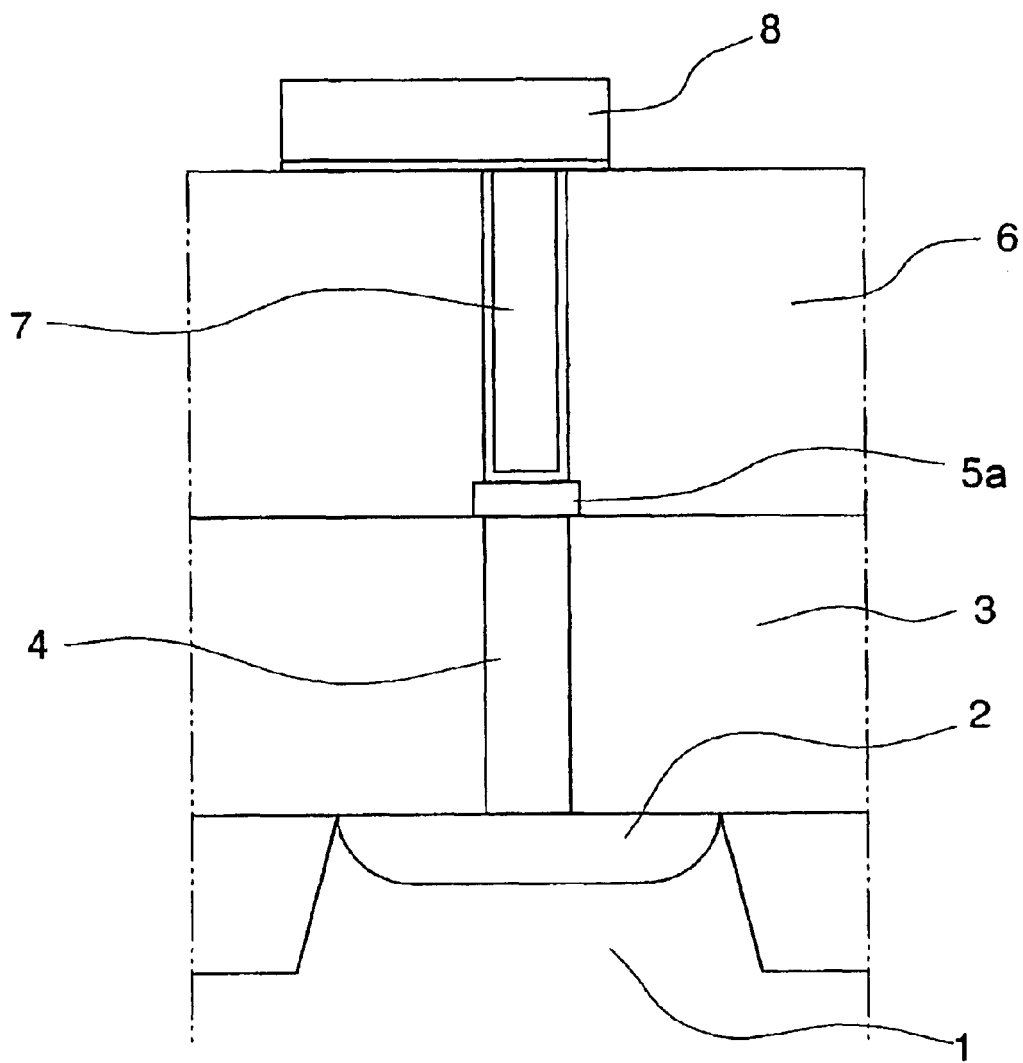
FIG. 4 is a cross-sectional view of a semiconductor device according to the second embodiment of the present invention.

FIG. 4 is a cross-sectional view showing the structure of the semiconductor device according to the second embodiment of the present invention. As shown in FIG. 4, a structural example is shown, in which a silicide pad 5a for connecting the silicon plug 4 and a tungsten plug 7 is not formed in a U-shape.

Figure 5A:
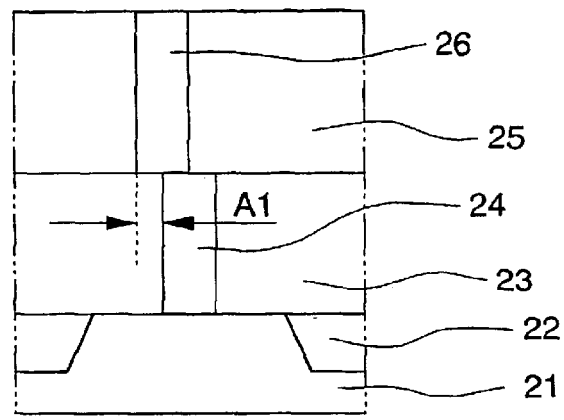
FIGS. 5A to 5C are diagrams showing structures for connection between a conventional semiconductor substrate and an upper layer wiring.
Figure 5B:
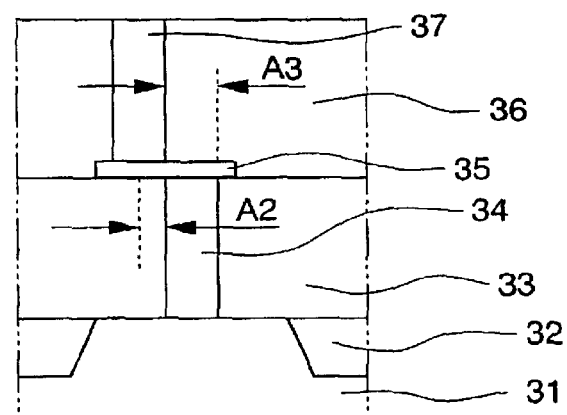
Figure 5C:
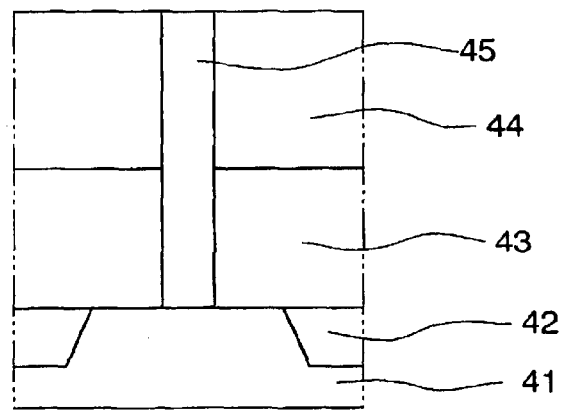
Figure 6:
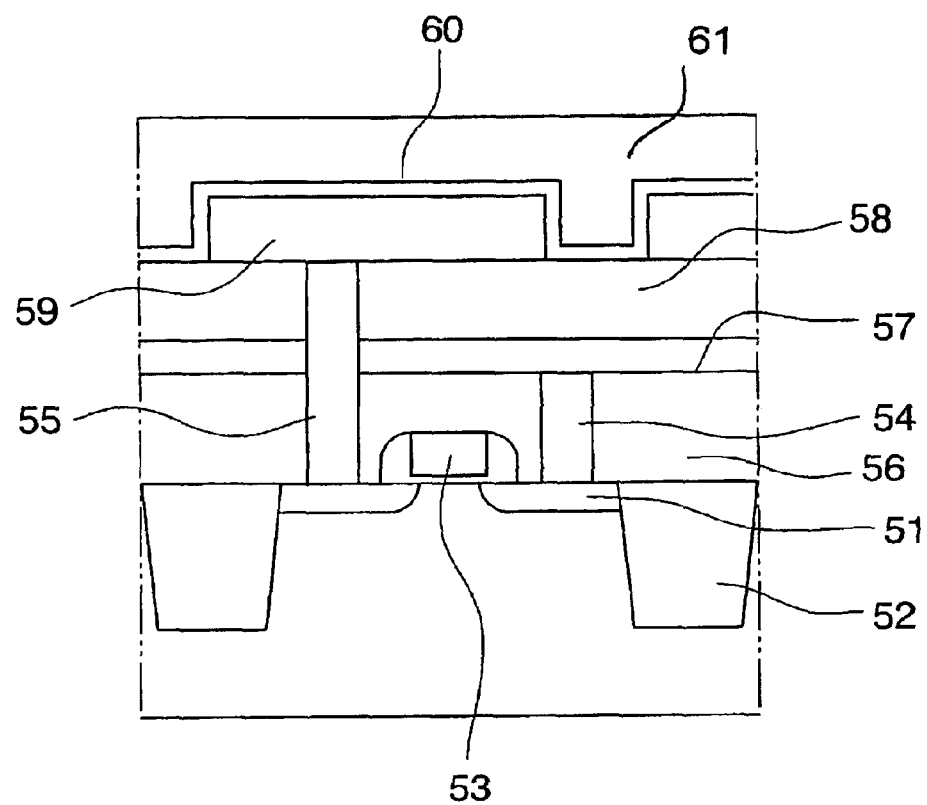
FIG. 6 is a diagram showing an example of the cross-sectional structure of a conventional semiconductor device.

That is, as shown in FIG. 4, the silicide pad 5a on the upper end of the polysilicon plug 4 is not necessarily formed in a U-shape. The interface between the polysilicon plug 4 and the silicide pad 5a may be located on the same level as the upper plane of the first interlayer insulating film 3 or below. In this case, it is a feature of the present invention that the outside area of the silicide pad extending from the silicon plug is symmetrical about the center of the silicon plug. In the conventional devices shown in FIG. 5, the silicide pad is not positioned in a self-aligning manner, the silicide pads shifts within the range of mechanical error. That is, when viewed in the cross-sectional direction, the pad is not located symmetrically about the center of the silicon plug. The silicide pad is positioned in a self-aligning manner in the present invention, so that the silicide pad can be formed symmetrically about the silicon plug.

As described above, the present invention exhibits the following favorable effect. That is, the semiconductor device of the present invention includes a contact plug, formed by opening a contact hole through the first interlayer insulating film and by filling the contact hole with silicon. Then, a silicide pad, which has a larger diameter than that of the silicon plug, is formed on the top end of the silicon plug in a self-aligning manner such that the upper surface of the silicide pad is located higher than the first interlayer insulating film. Thereby, it is possible to reduce malfunction of the semiconductor devices by failed connection of silicon plugs without generating defective products and causing an increase in the contact resistance of the silicon plugs.

What is claimed is:

1. A structure for a semiconductor device, provided with a contact plug, which is formed by forming a contact hole through a first interlayer insulating film on a silicon substrate and by filling the contact hole with silicon, comprising:

a silicide pad formed on the top surface of the silicon contact plug in a self-aligning manner with said silicon contact plug and having a diameter which is larger than that of the silicon contact plug;

wherein, a portion of said silicon contact plug extends beyond the first interlayer insulating film so that the top surface of said silicide pad is formed above the top surface of said first interlayer insulating film, said silicide pad contacting an entirety of said portion of said silicon contact plug that extends beyond the first interlayer insulating film.

2. A structure of a semiconductor device according to claim 1, wherein said silicide pad is formed by a refractory metal silicide.

3. A structure of a semiconductor device according to claim 1, wherein said refractory metal silicide is any one of titanium silicide and cobalt silicide.

4. A method for manufacturing a semiconductor device provided with a contact plug, which is formed by opening a contact hole through a first interlayer insulating film formed on a silicon substrate and filling the contact hole with silicon, comprising forming a first insulating film on said silicon substrate;

forming said contact hole through said first interlayer insulating film;

filling said contact hole with a silicon plug; and forming a silicide pad in a self-aligning manner with the silicon plug, the silicide pad having a larger diameter than that of said silicon plug, wherein the step of forming said silicide pad includes the steps of:

selectively and partially removing the insulating film and silicon at least in the vicinity of said contact plug such that the plug protrudes;

depositing a refractory metal film;

converting the refractory metal film into a refractory metal silicide by a heat treatment; and removing said refractory metal film remaining without being converted into silicide and reaction products between said refractory metal and an atmospheric gas during the heat treatment.

5. A method for manufacturing a semiconductor device according to claim 4, wherein said refractory metal is at least any one of titanium and cobalt.

6. A structure of a semiconductor device, comprising:

a silicon substrate;

a first interlayer insulating film having a first surface connected to said substrate;

a polysilicon contact plug formed through said first interlayer insulating film having a top end surface and a top side surface protruding from a second surface of said first insulating layer, so as to form a protrusion;

a silicide pad formed covering said top end surface and said top side surface of said polysilicon contact plug in a self-aligning manner with said polysilicon contact plug, so that said silicide pad contacts an entirety of said protrusion and said silicide pad having a diameter which is larger than a diameter of the polysilicon contact plug, said silicide pad being above said second surface of said first interlayer insulating film.

7. The structure of a semiconductor device according to claim 6, wherein said silicide pad is a refractory metal silicide.

8. The structure of a semiconductor device according to claim 6, wherein said refractory metal silicide is at least one of titanium silicide, tungsten silicide, molybdenum silicide, tantalum silicide and cobalt silicide.

9. The structure of a semiconductor device according to claim 6, further comprising:

a second interlayer insulating film on the second surface of said first interlayer insulating film and on said silicide pad;

a tungsten plug through said second interlayer insulating film and aligned with the polysilicon contact plug, said tungsten plug contacting said silicide pad; and an aluminum copper alloy connected to said second interlayer insulating film and said tungsten plug.

10. A structure of a semiconductor device, comprising:

a silicon substrate;

a first interlayer insulating film having a first surface on the substrate;

a polysilicon contact plug through said first interlayer insulating film, said polysilicon contact plug having a protruding portion extending beyond said first interlayer insulating film;

a silicide pad formed on a said protruding portion so that said silicide pad contacts an entirety of said protruding portion, said silicide pad being formed in a self-aligning manner with said polysilicon contact plug and having a diameter which is larger than the polysilicon contact plug, a first surface of said silicide pad being above a second surface of said interlayer insulating film; and a second interlayer insulating film on said first interlayer insulating film on said silicide pad.

11. A structure of a semiconductor device according to claim 10, further comprising:

an upper plug on the polysilicon plug and through said second interlayer insulating film and aligned with the polysilicon contact plug;

and a conductive film connected to said second interlayer insulating film and said upper plug.

12. A method for manufacturing a semiconductor device, comprising the steps of:

forming a silicon substrate;

forming a first interlayer insulating film above the silicon substrate;

forming a first contact hole though the first interlayer insulating film;

forming a polysilicon layer on the first interlayer insulating film, the polysilicon layer filling the contact hole and forming a polysilicon plug;

selectively and partially removing the first insulating film and the polysilicon layer at least in the vicinity of the polysilicon plug such that the polysilicon plug protrudes from the first interlayer insulating layer; and forming a silicide pad on the polysilicon plug in a self-aligning manner with the polysilicon plug, the silicide pad having a diameter larger than a diameter of the polysilicon plug, a first surface of the silicide pad being disposed above an upper surface of the first interlayer insulating film, said silicide pad being formed by:

depositing a refractory metal film over the polysilicon plug and the first interjayer insulating layer;

heat treating the refractory metal film, said heat treating step converting first sections of the refractory metal film into a refractory metal silicide and forming reaction products;

removing second sections of the refractory metal film that were not converted into refractory metal silicide, the first sections being the silicide pad; and removing the reaction products that were formed during the heat treating step.

13. The method for manufacturing a semiconductor device according to claim 12, wherein the refractory metal is at least one of titanium, tungsten, molybdenum, tantalum and cobalt.

14. The method for manufacturing a semiconductor device according to claim 12, further comprising the steps of:

forming a second interlayer insulating film on the first interlayer insulating film and on the silicide pad;

forming a second contact hole through the second interlayer insulating film, the second contact hole extending to the silicide pad;

forming a titanium nitrite layer on walls of the second contact hole and on the silicide pad;

filling the contact hole with tungsten to form a tungsten plug, the tungsten plug contacting the titanium nitrite layer and being connected to the polysilicon plug through the silicide pad and being aligned with the polysilicon plug; and forming a tungsten layer on the second interlayer insulating film and contacting the tungsten plug.

15. A method for manufacturing a semiconductor device, comprising the steps of:

forming a silicon substrate;

forming a first interlayer insulating film above the silicon substrate;

forming a first contact hole through the first interlayer insulating film;

forming a polysilicon layer on the first interlayer insulating film, the polysilicon layer filling the contact hole and forming a polysilicon plug;

forming a silicide pad in a self-aligning manner with the polysilicon plug, the silicide pad having a diameter larger than a diameter of the polysilicon plug, a first surface of the silicide pad being disposed above an upper surface of the first interlayer insulating film;

forming a second interlayer insulating film on the first interlayer insulating film and on the silicide pad;

forming a second contact hole through the second interlayer insulating film, the second contact hole extending to the silicide pad;

forming a titanium nitrite layer on walls of the second contact hole and on the silicide pad;

filling the contact hole with tungsten to form a tungsten plug, the tungsten plug contacting the titanium nitrite layer and being connected to the polysilicon plug through the silicide pad and being aligned with the polysilicon plug; and forming a tungsten layer on the second interlayer insulating film and contacting the tungsten plug, wherein the step of forming said silicide ad includes the steps of:

selectively and partially removing the insulating film and silicon at least in the vicinity of said contact plug such that the plug protrudes;

depositing a refractory metal film;

converting the refractory metal film into a refractory metal silicide by a heat treatment; and removing said refractory metal film remaining without being converted into silicide and reaction products between said refractory metal and an atmospheric gas during the heat treatment.

16. The semiconductor device according to claim 11, wherein said upper plug is metal.

17. Method according to claim 12, further comprising the step of forming a metal plug on said silicide pad.

18. The structure for a semiconductor device as claimed in claim 1, wherein said silicide pad is substantially U-shaped in cross-section.

* * * * *